United States Patent
Chandra et al.

(10) Patent No.: US 10,158,368 B2
(45) Date of Patent: Dec. 18, 2018

(54) DIGITAL-TO-ANALOG CONVERTER (DAC) WITH PARTIAL CONSTANT SWITCHING

(71) Applicant: MaxLinear, Inc., Carlsbad, CA (US)

(72) Inventors: Gaurav Chandra, Carlsbad, CA (US); Tao Zeng, Carlsbad, CA (US); Shantha Murthy Prem Swaroop, Carlsbad, CA (US); Jianyu Zhu, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 15/997,336

(22) Filed: Jun. 4, 2018

(65) Prior Publication Data

US 2018/0287624 A1   Oct. 4, 2018

Related U.S. Application Data

(63) Continuation of application No. 15/790,343, filed on Oct. 23, 2017, now Pat. No. 9,991,899, which is a continuation of application No. 15/130,602, filed on Apr. 15, 2016, now Pat. No. 9,800,254.

(60) Provisional application No. 62/148,479, filed on Apr. 16, 2015.

(51) Int. Cl.
    *H03M 1/06* (2006.01)
    *H03M 1/66* (2006.01)

(52) U.S. Cl.
    CPC ............ *H03M 1/0624* (2013.01); *H03M 1/66* (2013.01)

(58) Field of Classification Search
    CPC .............................. H03M 1/0624; H03M 1/66
    USPC .......................................... 341/118, 144, 145
    See application file for complete search history.

(56) References Cited

U.S. PATENT DOCUMENTS

6,392,573 B1 * 5/2002 Volk ................ H03K 17/04106
                                                341/118
6,842,132 B2 * 1/2005 Schafferer ............ H03M 1/068
                                                341/136

* cited by examiner

*Primary Examiner* — Khai M Nguyen
(74) *Attorney, Agent, or Firm* — McAndrews, Held & Malloy, Ltd.

(57) ABSTRACT

A digital-to-analog converter (DAC) controller system may be configured for controlling switching in an associated digital-to-analog converter (DAC), based on a plurality of system inputs that include at least a first system input corresponding to an input applied to the DAC for controlling switching therein, and a second system input that includes a reference control signal. The DAC controller system may include a logic gate circuit that generates a gate output based on two gate inputs that include the first system input and an input set based on the second system input; and a plurality of timing circuits that generate timing outputs for controlling timing of switching in the DAC, which include at least one timing circuit that generates a timing output based on the gate output, with the timing output configured for application in conjunction with and for adjusting a timing output of another timing circuit.

10 Claims, 7 Drawing Sheets

DIGITAL-TO-ANALOG CONVERTER (DAC) WITH PARTIAL CONSTANT SWITCHING

CLAIM OF PRIORITY

This patent application is a continuation of U.S. patent application Ser. No. 15/790,343, filed on Oct. 23, 2017, which is a continuation of U.S. patent application Ser. No. 15/130,602, filed on Apr. 15, 2016, which makes reference to, claims priority to and claims benefit from each of U.S. Provisional Patent Application Ser. No. 62/148,479, filed on Apr. 16, 2015. Each of the above identified application is hereby incorporated herein by reference in its entirety.

This patent application also makes reference to:
U.S. patent application Ser. No. 15/130,636, filed on Apr. 15, 2016, now issued as U.S. Pat. No. 9,692,435; and
U.S. patent application Ser. No. 15/130,617, filed on Apr. 15, 2016, now issued as U.S. Pat. No. 9,762,256.

Each of the above identified applications is hereby incorporated herein by reference in its entirety.

TECHNICAL FIELD

Aspects of the present disclosure relate to signal processing. More specifically, various implementations of the present disclosure relate to digital-to-analog converter (DAC) with partial constant switching.

BACKGROUND

Conventional approaches for performing digital-to-analog conversions may be costly, cumbersome, or inefficient—e.g., they may be complex and/or time consuming, require considerable power, and/or may introduce errors or distortion. Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for digital-to-analog converter (DAC) with partial constant switching, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION

As utilized herein the terms "circuits" and "circuitry" refer to physical electronic components (e.g., hardware), and any software and/or firmware ("code") that may configure the hardware, be executed by the hardware, and or otherwise be associated with the hardware. As used herein, for example, a particular processor and memory (e.g., a volatile or non-volatile memory device, a general computer-readable medium, etc.) may comprise a first "circuit" when executing a first one or more lines of code and may comprise a second "circuit" when executing a second one or more lines of code. Additionally, a circuit may comprise analog and/or digital circuitry. Such circuitry may, for example, operate on analog and/or digital signals. It should be understood that a circuit may be in a single device or chip, on a single motherboard, in a single chassis, in a plurality of enclosures at a single geographical location, in a plurality of enclosures distributed over a plurality of geographical locations, etc. Similarly, the term "module" may, for example, refer to a physical electronic components (e.g., hardware) and any software and/or firmware ("code") that may configure the hardware, be executed by the hardware, and or otherwise be associated with the hardware.

As utilized herein, circuitry or module is "operable" to perform a function whenever the circuitry or module comprises the necessary hardware and code (if any is necessary) to perform the function, regardless of whether performance of the function is disabled or not enabled (e.g., by a user-configurable setting, factory trim, etc.).

As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." As utilized herein, the term "exemplary" means serving as a non-limiting example, instance, or illustration. As utilized herein, the terms "for example" and "e.g." set off lists of one or more non-limiting examples, instances, or illustrations.

Figure 1:
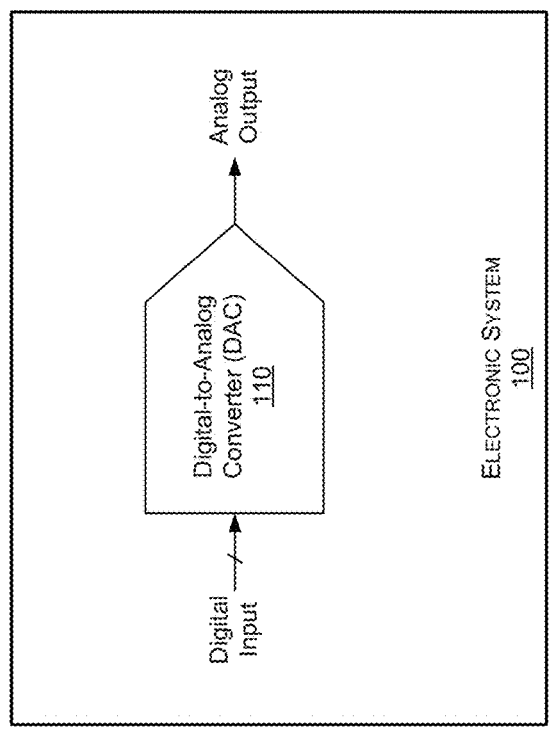
FIG. 1 illustrates an example electronic system that may be operable to perform digital-to-analog conversions.

FIG. 1 illustrates an example electronic system that may be operable to perform digital-to-analog conversions. Shown in FIG. 1 is an electronic system 100.

The electronic system 100 may comprise suitable circuitry for implementing various aspects of the present disclosure. The electronic system 100 may be configured to support performing, executing or running various operations, functions, applications and/or services. The electronic system 100 may be used, for example, in executing computer programs, playing video and/or audio content, gaming, performing communication applications or services (e.g., Internet access and/or browsing, email, text messaging, chatting and/or voice calling services), providing networking services (e.g., WiFi hotspot, Bluetooth piconet, Ethernet networking, cable or satellite systems, and/or active 4G/3G/femtocell data channels), or the like.

In some instances, the electronic system 100 may enable and/or support communication of data. In this regard, the electronic system 100 may need to communicate with other systems (local or remote), such as during executing, running, and/or performing of operations, functions, applications and/or services supported by the electronic system 100. For example, the electronic system 100 may be configured to support (e.g., using suitable dedicated communication components or subsystems) use of wired and/or wireless connections/interfaces, which may be configured in accordance with one or more supported wireless and/or wired protocols or standards, to facilitate transmission and/or reception of signals (carrying data) to and/or from the electronic system 100. In this regard, the electronic system 100 may be operable to process transmitted and/or received signals in accordance with applicable wired or wireless protocols.

Examples of wireless standards, protocols, and/or interfaces that may be supported and/or used by the electronic system 100 may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+(e.g., GSM/GPRS/EDGE, and IS-95 or cdmaOne) and/or 2G/2G+(e.g., CDMA2000, UMTS, and HSPA); 4G standards, such as WiMAX (IEEE 802.16) and LTE; Ultra-Wideband (UWB), and/or the like.

Examples of wired standards, protocols, and/or interfaces that may be supported and/or used by the electronic system 100 may comprise Ethernet (IEEE 802.3), Fiber Distributed Data Interface (FDDI), Integrated Services Digital Network (ISDN), cable television and/or internet access standards (e.g., ATSC, DVB-C, DOCSIS, etc.), in-home distribution standards such as Multimedia over Coax Alliance (MoCA), and Universal Serial Bus (USB) based interfaces.

Examples of signal processing operations that may be performed by the electronic system 100 may comprise, for example, filtering, amplification, analog-to-digital conversion and/or digital-to-analog conversion, up-conversion/down-conversion of baseband signals, encoding/decoding, encryption/decryption, and/or modulation/demodulation.

In some instances, the electronic system 100 may be configured to support input/output (I/O) operations, to enable receiving input from and/or providing output to users. Accordingly, the electronic system 100 may comprise components or subsystems for obtaining user input and/or providing output to the user. For example, the electronic system 100 may support input/output (I/O) operations for allowing user interactions which may be needed for controlling the electronic system 100 or operations thereof—e.g., allowing users to provide input or commands, for controlling certain functions or components of the electronic system 100, and/or to output or provide feedback pertaining to functions or components. The electronic system 100 may also support input/output (I/O) operations in conjunction with use of data (e.g., multimedia content). For example, the electronic system 100 may support generating, processing, and/or outputting of video and/or acoustic signals, such as via suitable output devices or components (e.g., displays, loudspeakers, etc.). In this regard, the output signals may be generated based on content, which may be in digital form (e.g., digitally formatted music or the like). Similarly, the electronic system 100 may support capturing and processing of video and/or acoustic signals, such as via suitable input devices or components (e.g., cameras, microphones, etc.), to generate (e.g., to store or communicate) corresponding data. The corresponding data may be in digital form (e.g., digitally formatted music, video, or the like).

The electronic system 100 may be a stationary system (e.g., being installed at, and/or configured for use only in particular location). In other instances, however, the electronic system 100 may be a mobile device—i.e. intended for use on the move and/or at different locations. In this regard, the electronic system 100 may be designed and/or configured (e.g., as handheld device) to allow for ease of movement, such as to allow it to be readily moved while being held by the user as the user moves, and the electronic system 100 may be configured to perform at least some of the operations, functions, applications and/or services supported on the move.

Examples of electronic systems may comprise handheld electronic devices (e.g., cellular phones, smartphones, or tablets), computers (e.g., laptops, desktops, or servers), dedicated media devices (e.g., televisions, game consoles, or portable media players, etc.), set-top boxes (STBs) or other similar receiver systems, and the like. The disclosure, however, is not limited to any particular type of electronic system.

In operation, the electronic system 100 may be operable to perform various operations, functions, applications and/or services. For example, in some instances, electronic system 100 may be operable to communicate (send and/or receive) data, and to process the communicated data. In this regard, communication of data, whether over wired or wireless interfaces, may typically comprise transmitting and/or receiving signals that are communicated over wireless and/or wired connections. For example, analog radio frequency (RF) signals may be used to carry data (e.g., content), with the data being embedded into the analog signals in accordance with particular analog or digital modulation schemes. For analog communications, data is transferred using continuously varying analog signals, and for digital communications, the analog signals are used to transfer discrete messages in accordance with a particular digitalization scheme. Thus, handling of digital communications (e.g., in the electronic system 100) may typically require performing, among other things, digital-to-analog conversions on the transmitter-end and analog-to-digital conversions at the receiver-end.

Digital-to-analog conversions and/or analog-to-digital conversions may also be performed in the electronic system 100 during other (non-communicative) operations. For example, during audio/video related operations, audio/video content that is typically formatted in digital form may be processed to generate corresponding analog audio or video signals during output operations, and captured audio and/or video analog signals may be processed, to generate the digital audio/video content. That processing may comprise performing digital-to-analog conversions (e.g., during output operations), and/or analog-to-digital conversions (e.g., during input operations).

Accordingly, the electronic system 100 may incorporate suitable components for providing digital-to-analog conversions and/or analog-to-digital conversions. For example, the electronic system 100 may comprise one or more digital-to-analog converters (DACs) 110. Each DAC 110 may comprise suitable circuitry for performing digital-to-analog conversions. The DACs 110 may be utilized, e.g., during signal processing, such as to allow converting digital data into analog waveforms—e.g., corresponding to and/or being embedded into acoustic signals, radio frequency (RF) signals, etc. The disclosure, however, is not limited to any particular use scenario, and may be utilized in any appropriate setup performing or requiring digital-to-analog conversions.

Various architectures and/or designs may be used for digital-to-analog conversions and/or in implementing corresponding digital-to-analog converters (DACs). Example types of DACs include pulse-width modulation (PWM) DACs, binary-weighted DACs, oversampling or interpolating (e.g., delta-sigma) DACs, R-2R ladder DACs, successive-approximation (or cyclic) DACs, thermometer-coded DACs, etc. In each of these DAC architectures and/or designs, digital-to-analog conversions may be achieved by adjusting a particular parameter (e.g., voltage, current, etc.) based on input binary data, in a particular manner. For example, with current-steering DACs, the digital-to-analog conversion may be performed based on steering of current from various sources, with the steering being controlled or adjusted based on the input digital data (sequence of bits).

In some instances, DACs may incorporate combined or hybrid implementation or architecture, whereby parts of the DAC may be configured for handling particular portions of the digital input code to be converted. For example, the DAC 110 may be implemented using segmented architecture, comprising a segment for handling the most significant bits (MSBs) of the digital input (MSB segment), and one or more other segments for handling the remaining part(s) of the digital input (e.g., the least significant bits (LSBs) of the digital input). In a particular example implementation, the MSB segment may comprise unit-weighted elements and may be thermometer-coded. The number of bits handled in the MSB segment may vary. The one or more other segments may be implemented using less costly techniques or architectures (e.g., based on binary-coded toggling).

Various issues may arise with DACs and operations thereof, which may need to be accounted for and/or addressed to optimize performance or operation of the DACs. Some of these issues may be general (e.g., affecting and/or existing in all DAC designs and digital-to-analog conversion techniques), while other issues may be specific, being limited to particular types of DAC, to particular digital-to-analog conversion techniques, to particular operation or use conditions, etc. Such issues may need be accounted for or addressed in order to optimize performance or operation of the DACs.

For example, in some instances, the DACs may be configured such that they may not be operating at full scale—e.g., the signal may be backed off from full scale. In this regard, "full scale" represents the maximum signal amplitude a system can present (or handle), and as such signals may be described as "backed off" or operating at a "backoff" condition when not reaching full scale. Thus, a high backoff means very small signal amplitude, comparatively smaller than full scale; a low backoff means signal amplitude close to full scale; and no backoff means a full scale signal—that is having amplitude at full scale. In this regard, backoff conditions may have varying effects on DACs based on the architectures used, and/or particular functions incorporated therein.

Nonetheless, in some instances it may be possible to take advantage of certain signal conditions such as high backoff. For example, in high speed, high performance DACs, performance can be limited by the signal dependent supply currents drawn by the DAC thereby causing large voltage ripple on the regulator supplies in the DAC. Often, a technique called constant switching is implemented to reduce signal dependent voltage ripple to ensure that good performance may be achieved. Conventionally, however, this is done for the entire DAC array (e.g., all elements in the DAC array handling all bits in the input data), which would result in significant overhead (e.g., in term of cost for adding the additional components, increased die space utilization, power consumption etc.).

Accordingly, in various implementations of the present disclosure, DACs may be configured or implemented with partial constant switching, to optimize performance (e.g., provide improved constant switching at lower cost). An example system for use in providing partial constant switching is described in more detail with respect to FIG. 2A.

Further, in some instances DACs implemented in accordance with the present disclosure may incorporate additional features and/or functions for further enhancing operations of the DACs. For example, in some instances these DACs may support use of digital offsets as described in U.S. patent application Ser. No. 15/130,636, filed on Apr. 15, 2016, and entitled "DIGITAL-TO-ANALOG CONVERTER (DAC) WITH DIGITAL OFFSETS"; and/or enhanced dynamic element matching (DEM) and calibration techniques as described in U.S. patent application Ser. No. 15/130,617, filed on Apr. 15, 2016, and entitled "DIGITAL-TO-ANALOG CONVERTER (DAC) WITH ENHANCED DYNAMIC ELEMENT MATCHING (DEM) AND CALIBRATION".

Figure 2A:
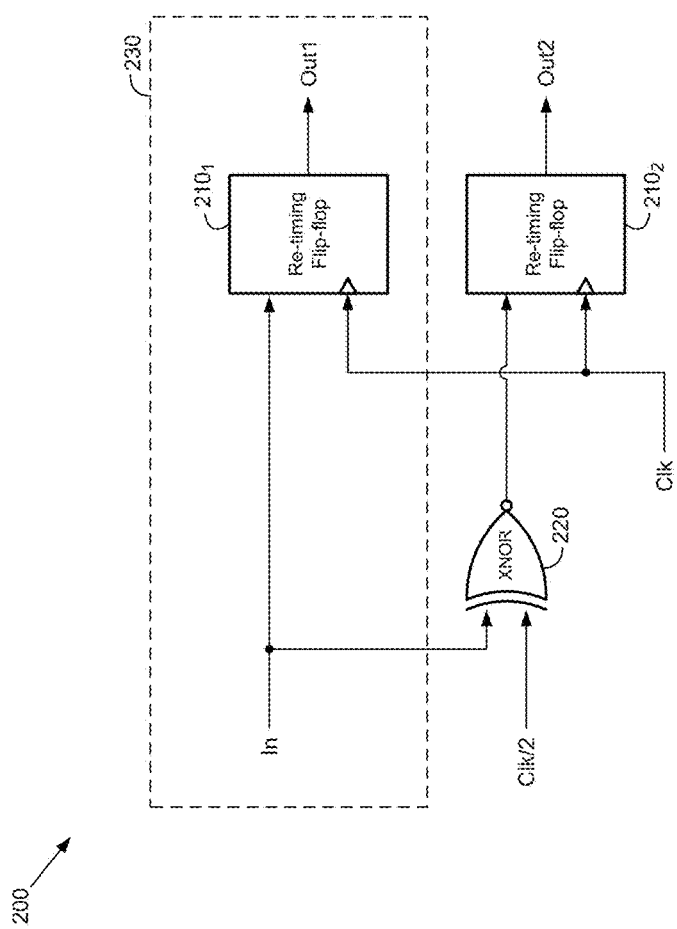
FIG. 2A illustrates an example constant switching controller, for use in digital-to-analog convertors (DACs).

FIG. 2A illustrates an example constant switching controller, for use in digital-to-analog convertors (DACs). Shown in FIG. 2A is constant switching controller 200.

The constant switching controller 200 may comprise suitable circuitry for implementing various aspects of the present disclosure. In particular, the constant switching controller 200 may be operable to control switching, specifically to provide constant switching. In this regard, the constant switching controller 200 may be used to control switching in DACs based on input signals (e.g., switching of DAC elements, each of which may be used in handling one or more bits of a digital input code), to ensure constant switching such as during power burst based operations.

Figure 2B:
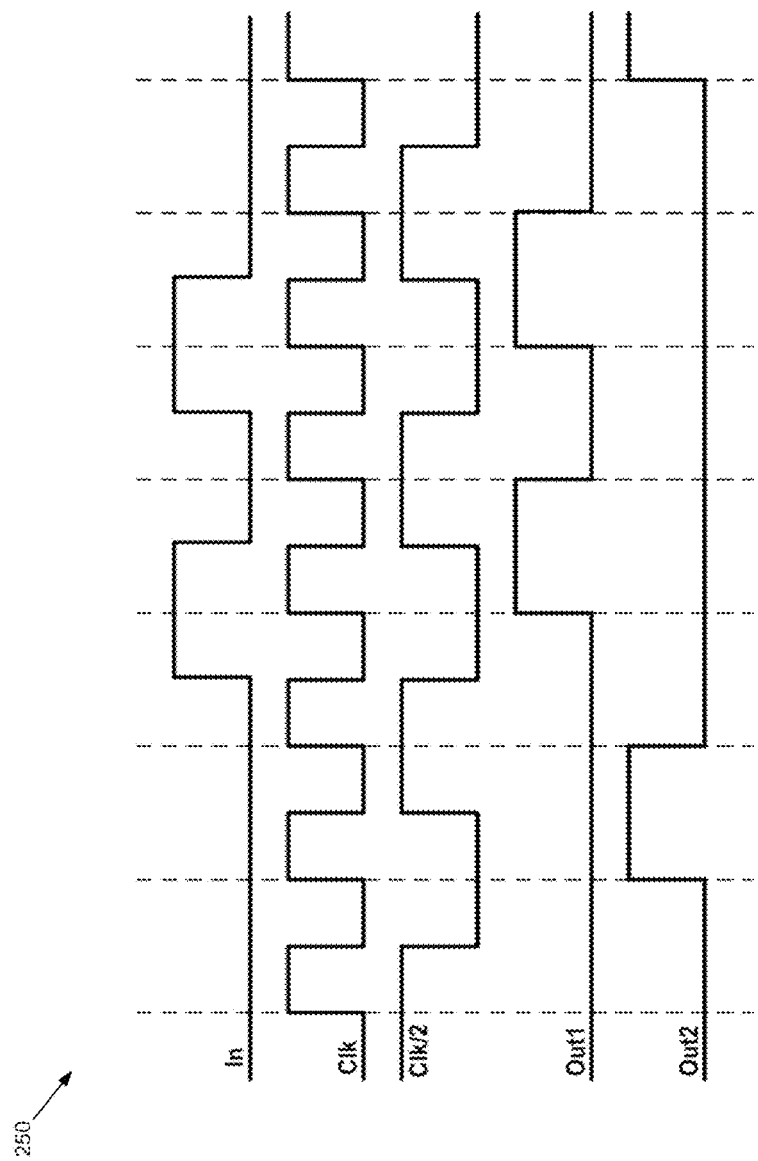
FIG. 2B illustrates an example timing diagram for various signals in an example constant switching controller.

As shown in FIG. 2A, the constant switching controller 200 may comprise a pair of re-timing flip-flops $210_1$ and $210_2$ and a XNOR gate 220. The portion of the implementation of constant switching controller 200 shown in FIG. 2A that is marked as 230 may represent 'conventional' switching control, where input used in switching elements of the corresponding system (e.g., elements in the DAC) is simply stored and then released via one of the re-timing flip-flops (e.g., the re-timing flip-flop $210_1$), based on a clock signal Clk. The constant switching by the constant switching controller 200 (with reference to the particular implementation depicted in FIG. 2A) may be done by generating a complimentary output signal (out2) opposed to the main output signal (out1) so that the switching frequency can be pushed to half of the clock frequency. This may be done by XNOR'ing the input (in) with a signal representing halving of the clock signal (that is Clk/2) via the XNOR 220. The output of the XNOR 220 is then applied to the second re-timing flip-flop $210_2$, which is also clocked using the clock signal Clk. Example timing diagrams for the various signals in the constant switching controller 200 is shown in FIG. 2B.

The generation of the secondary output (out2) may improve performance by providing constant switching (rather than abrupt switching). Further, the generation (and application) of the secondary output (out2) may also improve performance by, for example, ensuring that constant currents are drawn from low-dropout (LDO) regulators, independent of input signal characteristics. Nonetheless, while use of constant switching, using components such as multiple instances of the constant switching controller 200, may improve switching characteristics of the DAC, there may be some drawbacks for use of such components throughout the DAC. For example, use of constant switching throughout the entire DAC (e.g., for all elements in the DAC) may substantially increase the area, cost, and power consumption.

Accordingly, in various implementations in accordance with the present disclosure, the constant switching (e.g., via circuits such as the constant switching controller 200) may be limited to only a portion of the DAC, to improve overall switching characteristics of the DAC, while mitigating or minimizing the drawbacks of use of such technique. For example, rather than including in the DAC a dedicated instance of the constant switching controller 200 for each element in the DAC, constant switching may only be used partially in the DAC, being limited to only certain elements (or segments) in the DAC such as the most switching MSB elements (or segment) and the LSB elements (or array). Partial use of constant switching in this manner (e.g., only for certain elements, while remaining elements are switched conventionally—e.g., using for each only the circuit portion 230) may be fine as the elements subject to the constant switching may not be expected to switch (or to do so often). For example, limiting use of constant switching to a subset of the MSB elements may be sufficient because the probability of switching all MSB elements in backoff conditions is extremely low for the modulated signals. By using constant switching in such selective and partial manner, switching may be improved while also significantly saving power, area, and cost (since less and/or partial circuits are used in controlling switching for at least some of the elements in the DAC).

In an example implementation, DACs may be configured to support selective and/or adaptive use of constant switching. For example, the DAC may comprise only a small number of the constant switching controllers 200, which may be dynamically connected to different elements in the DAC (e.g., using suitable circuitry for connecting the constant switching controllers 200 to the DAC elements, and/or suitable circuitry for routing inputs corresponding to these DAC elements to the constant switching controllers 200). Thus, use of constant switching may be used adaptively, by connecting (or disconnecting) one or more of the constant switching controllers 200 to the different DAC elements (or segments). For example, constant switching may be completely disabled (by disconnecting all instances of the constant switching controller 200; or enabled for only particular element(s) (e.g., the MSB elements) by connecting the constant switching controller(s) 200 to these elements.

FIG. 2B illustrates an example timing diagram for various signals in an example constant switching controller. Shown in FIG. 2B is a timing diagram 250.

The timing diagram 250 illustrates an example of timing profiles for various signals used by and/or generated in the constant switching controller 200. In this regard, the timing diagram 250 shows timing of the input signal In and the global clock signal Clk, as well as the local clocking signal Clk/2, which may be obtained by halving of the global clock signal Clk (e.g., being cycled between "assert" and "de-assert" at twice the frequency of assert/de-assert for the global clock signal Clk, as shown in FIG. 2B for example). The timing of the three control signals (In, Clk, and Clk/2) may then dictate the asserting/de-asserting of the output signals out1 and out2, as shown in FIG. 2B for example.

Figure 3:
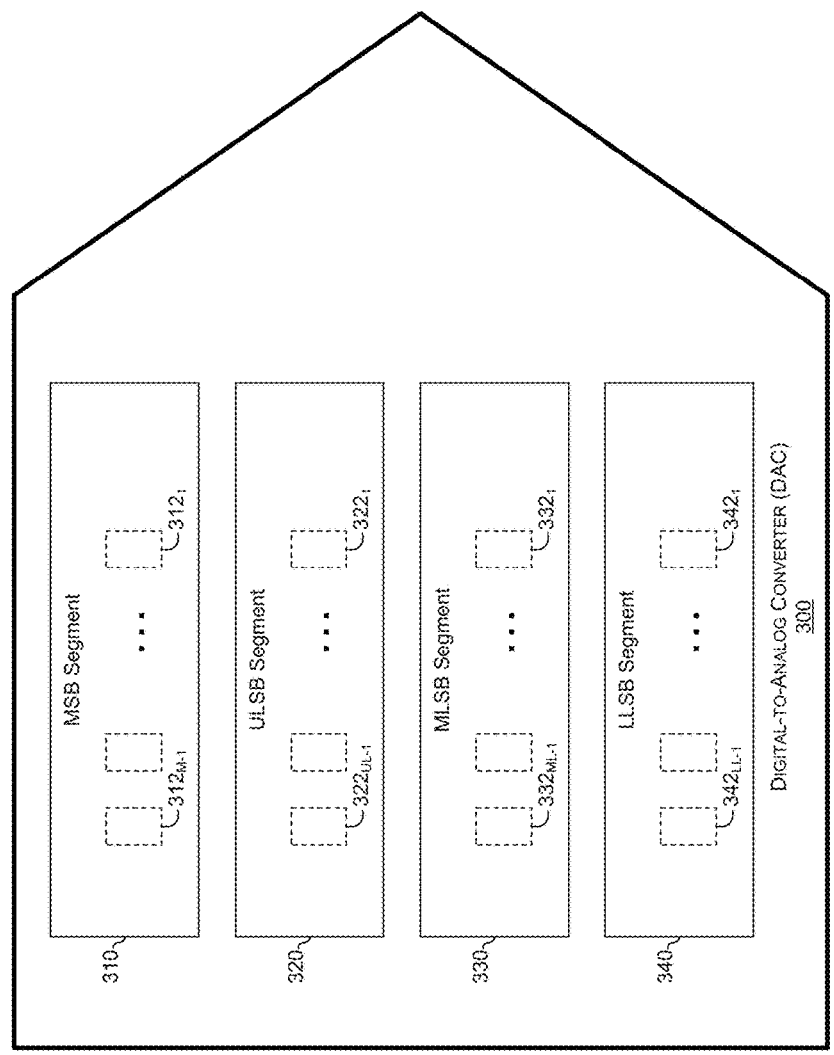
FIG. 3 illustrates an example implementation for a digital-to-analog convertor (DAC) supporting partial constant switching.

FIG. 3 illustrates an example implementation for a digital-to-analog convertor (DAC) supporting partial constant switching. Shown in FIG. 3 is DAC 300.

The DAC 300 may be similar to the DAC 100 of FIG. 1. In this regard, the DAC 300 may comprise suitable circuitry for performing digital-to-analog conversions. The DAC 300 may be a segmentation based implementation. For example, as depicted in FIG. 3, the DAC 300 may comprise four different segments 310, 320, 330, and 340 for handling respectively the MSBs, the upper LSBs (ULSBs), middle LSBs (MLSBs), and lower LSBs (LLSBs) of input (digital) codes converted via the DAC 300. In this regard, each of the segments 310, 320, 330, and 340 may comprise suitable circuitry for performing digital-to-analog conversions respectively to the input MSBs, the ULSBs, the MLSBs, and the LLSBs. The outputs of these segments may then be combined to provide the overall output of the DAC 300.

The size of (e.g. number of bits handled) of each of the segments may vary based on the particular implementation. For example, the DAC 300 may be implemented as 13-bit DAC, configured for 13 dB backoff input signal condition and 200 MHz input frequency, with a 4/3/3/3 segmentation—that is, e.g., 4 thermometer bits for the MSB segment 310; 3 thermometer bits for the ULSB segment 320; 3 thermometer bits for the MLSB segment 330; and 3 binary bits for the LLSB segment 340.

The number of elements in required in segmentation-based implementations is based on the segmentations incorporated thereto—e.g., the sum of number of elements in each of the segments. For example, in the DAC 300, the MSB segment 310 may comprise M elements (e.g., elements $312_M$-$312_1$), with the value of M being set on number of MSB bits, MSB_num (e.g., M=$2^{MSB\_num}$-1). The ULSB segment 320 may comprise UL elements (e.g., elements $322_{UL}$-$322_1$), with the value of UL being set based on number of ULSB bits, ULSB_num (e.g., UL=$2^{ULSB\_num}$-1). The MLSB segment 330 may comprise ML elements (e.g., elements $332_{UL}$-$332_1$), with the value of ML being set based on number of MLSB bits, MLSB_num (e.g., ML=$2^{MLSB\_num}$-1). The LLSB segment 340 may comprise LL elements (e.g., elements $322_{LL}$-$322_1$), with the value of LL being set based on number of LLSB bits, LLSB_num (e.g., LL=LLSB_num). Thus, with a 4/3/3/3 segmentation, the total required number of elements in the DAC is 32 elements (for the 4-bit MSB thermometer there are $2^4$-1=15 elements; for the 3-bit ULSB thermometer there are $2^3$-1=7 elements; for the 3-bit MLSB thermometer there are $2^3$-1=7 elements; for and the 3-bit LLSB binary there are 3 elements.

With conventional approaches, constant switching (e.g., using the circuit architecture described in FIG. 2A) would be used in all elements—e.g., in each of the 32 elements in the 4/3/3/3 segmentation described above. However, use of constant switching may not be always required for all elements. For example, with the 4/3/3/3 segmentation-based implementation describe above, it may be determined from the input conditions (e.g., based on simulations) that only 4 MSB elements (e.g., elements $322_{M-1}$ to $324_{M-4}$ and all LSB elements (elements $322_{UL}$-$322_1$, $332_{ML}$-$332_1$, and $342_{LL}$-$342_1$) are switching—that is 21 rather than 32 elements. Thus, in implementations in accordance with the present disclosure, partial constant switching may be used, with only elements that are switching being subject to constant switching.

In one example implementation, the DAC may be designed and implemented with only sub-set of elements incorporating constant switching. Thus, with reference to the previously described scenario, only the 21 elements deemed to be switching (rather than all 32 elements) would incorporate constant switching. The omission of constant switching in those non-switching elements would yield improvement in overall performance, due to reduction in power consumption and/or elimination of some circuitry (thus reduction in area, cost, etc.).

One potential drawback with such static implementation is that it would have to be use only where the input conditions match the conditions used or presumed during the design phase. Thus, in some instances partial constant switching may be implemented in adaptive manner, allowing for dynamic adjustments. For example, in one such implementation, all of the elements may incorporate the constant switching circuitry, and a controller element (not shown) may be used to assess the input conditions, and determine adaptively which of the elements would be switching. Thus, constant switching may be dynamically turned on/off in each of the elements.

This may be done by triggering control (enable/disable) signals to enable (or disable) constant switching function in each of the elements. This controller element may be an existing element in the system incorporating the DAC (e.g., processor or the like), which may be configured to perform such constant switching management function. Alternatively, the controller element may comprise a dedicated circuit incorporated directly into the DAC. With such approach, the improvement may be limited to power saving as all elements must support constant switching (e.g., incorporate constant switching circuitry), and additional circuitry may even be required (to provide the controller function).

Figure 4A:
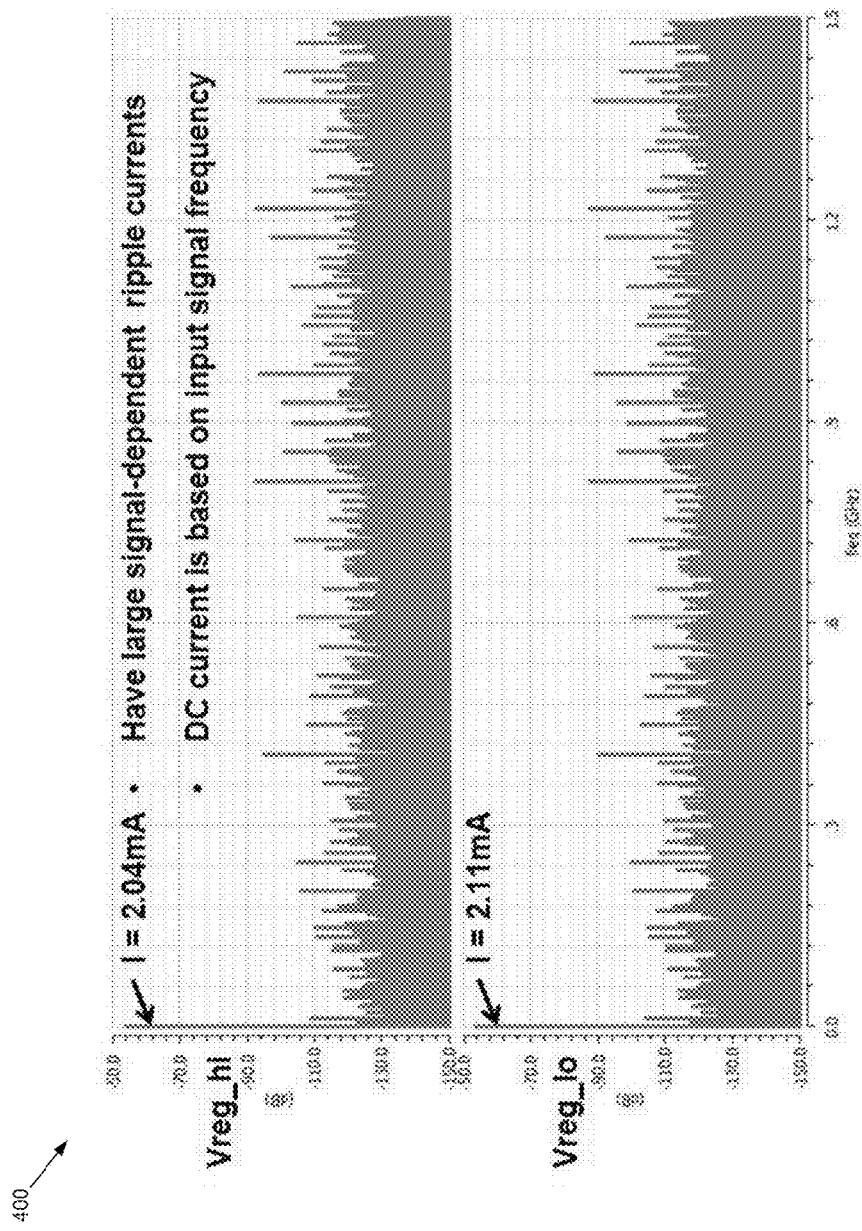
FIGS. 4A and 4B illustrate improvement that may be achieved from use of partial constant switching in particular example use scenario.
Figure 4B:
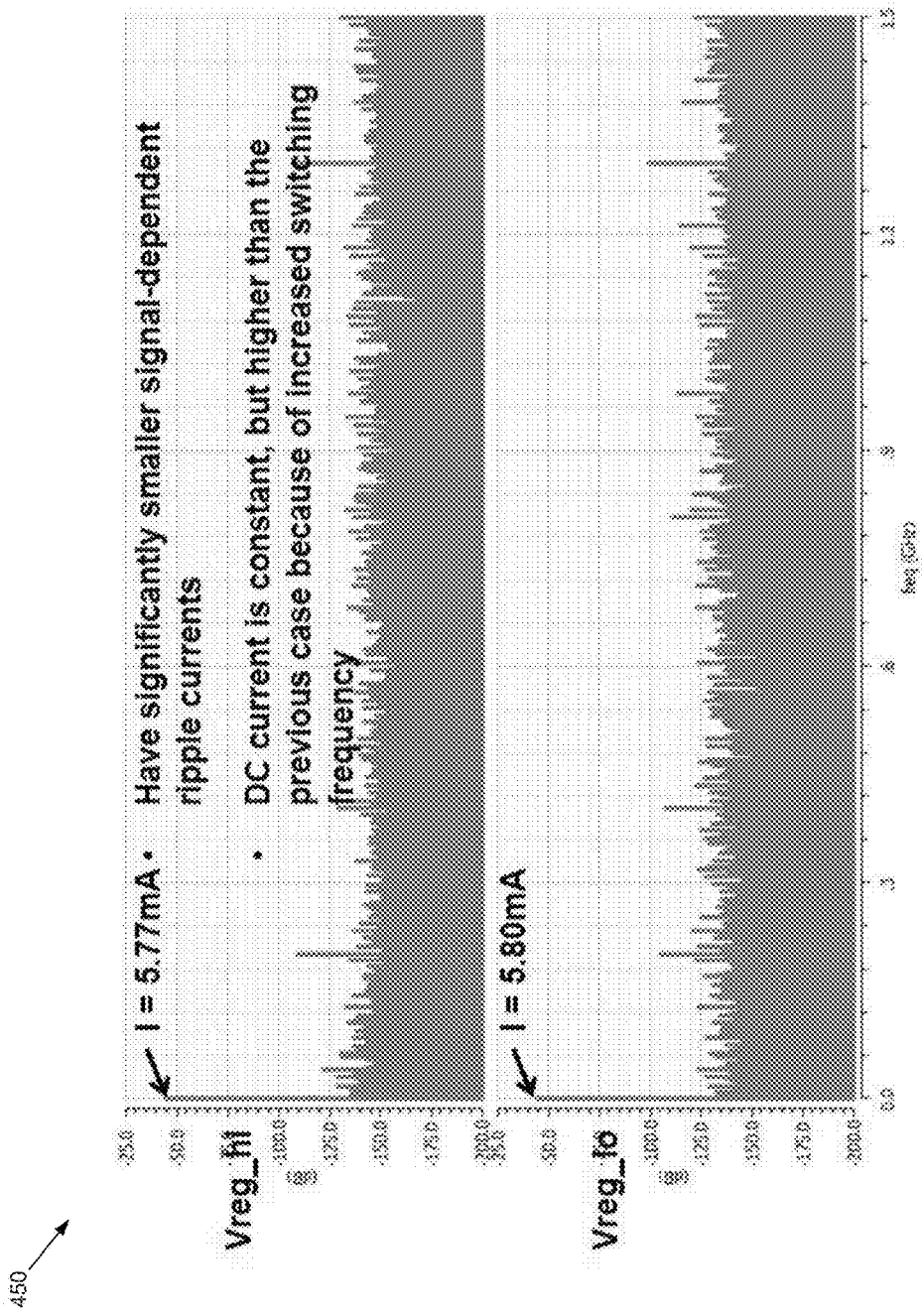

FIGS. 4A and 4B illustrate improvements that may be achieved from use of partial constant switching in a particular example use scenario. Shown in FIGS. 4A and 4B are diagram 400 and 450, which show the currents in an example DAC during a particular backoff scenario (e.g., backoff at 13 dB).

In particular, diagrams 400 and 450 contrast the frequency domain spectrum of the supply ripple currents in an example DAC without (diagram 400) and with (diagram 450) partial constant switching in a particular backoff condition (e.g., backoff at 13 dB). As shown in diagram 400, without partial constant switching, there may be large signal-dependent ripple currents, seen in the frequency domain spectrum at multiples of 200 MHz, which is the input signal frequency. On the other hand, as shown in diagram 450, with partial constant switching, there are much smaller signal-dependent ripple currents. However, with partial constant switching, the DC current may be constant but higher than DC current without partial constant switching, due to increased switching frequency.

Figure 5:
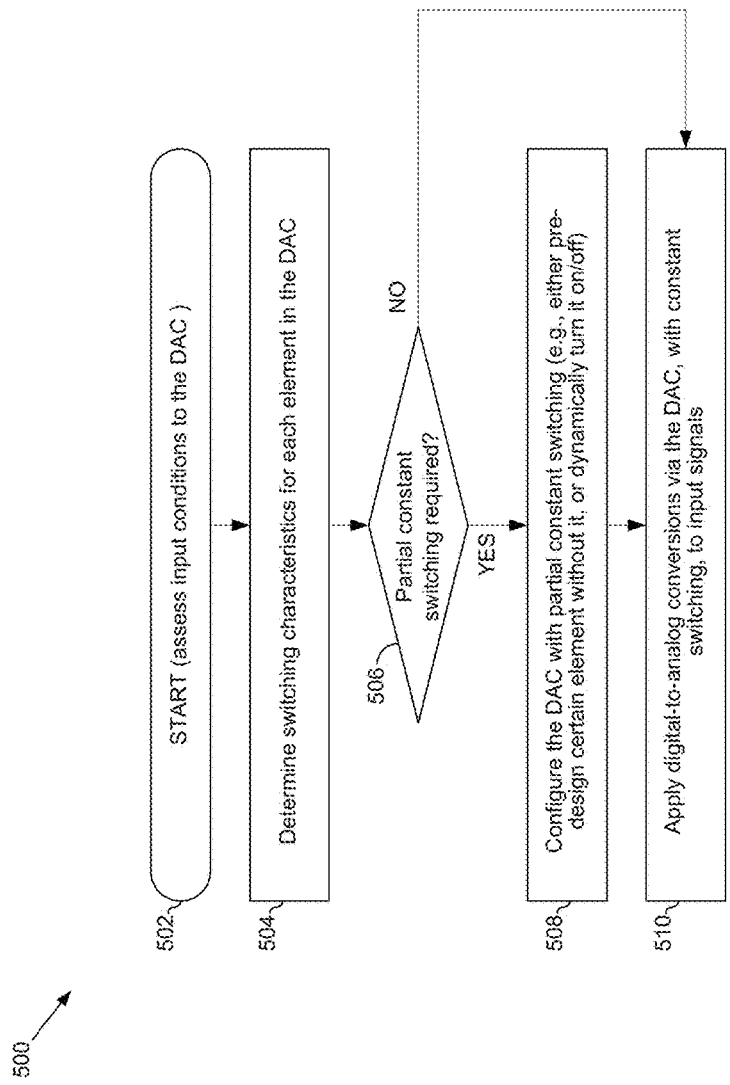
FIG. 5 illustrates a flowchart of an example process for utilizing adaptive partial power switching in digital-to-analog convertors (DACs).

FIG. 5 illustrates a flowchart of an example process for utilizing adaptive partial power switching in digital-to-analog convertors (DACs). Shown in FIG. 5 is flow chart 500, comprising a plurality of example steps (represented as blocks 502-510), for providing adaptive partial power switching in DACs (e.g., the DAC 100 of FIG. 1, the DAC 300 of FIG. 3, etc.).

In start step 502, input conditions to the DAC may be assessed (e.g., determine what the input code is, whether it includes particular sequences of 0s or 1s, etc.).

In step 504, switching characteristics for each element in the DAC may be determined. This may comprise determining for each element whether that element would switch (or not) for the particular input condition (e.g., the particular input code).

In step 506, it may be determined whether partial constant switching is required (or possible). For example, it may be determined whether the input condition match those previously identified in which only particular elements may switch. In instances where no partial constant switching in require or possible, the process may proceed directly to step 510; otherwise, the process proceeds to step 508.

In step 508, the DAC may be configured with partial constant switching (e.g., either during design/fabrication of the DAC, where certain element(s) are implemented without constant switching function/circuitry, or it may be dynamically, by incorporating constant switching function/circuitry into each element, but then turning it on or off).

In step 510, the DAC may apply digital-to-analog conversion to the input code, without constant switching (possibly partial constant switching).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:
1. A system comprising:
one or more circuits configured for controlling switching in a digital-to-analog converter (DAC) based on a plurality of system inputs that comprises at least a first system input and a second system input, the one or more circuits comprising:
a logic gate circuit that generates a gate output based on two gate inputs, wherein a first gate input comprises the first system input and a second gate input that is set based on the second system input; and a plurality of timing circuits that generate timing outputs for controlling timing of switching in the DAC, wherein:

a first timing circuit of the plurality timing circuits receives the first system input and the second system input, and generates a corresponding first timing output; and a second timing circuit of the plurality of timing circuits receives the gate output and the second system input, and generates a corresponding second timing output;

wherein the first system input comprises an input applied to the DAC for controlling switching in the DAC, and the second system input comprises a reference control signal.

2. The system of claim 1, wherein the logic gate circuit comprises an exclusive logical nor (XNOR) gate.

3. The system of claim 1, wherein the first timing circuit comprises a re-timing flip-flop circuit.

4. The system of claim 1, wherein the second timing circuit comprises a re-timing flip-flop circuit.

5. The system of claim 1, wherein the reference control signal comprises a clock signal.

6. The system of claim 5, wherein the second gate input is set as a ratio of the clock signal.

7. The system of claim 6, wherein the ratio of the clock signal is one-half ($\frac{1}{2}$).

8. The system of claim 1, wherein the first timing circuit and the second timing circuit are configured to apply the corresponding first timing output and second timing output together for adjusting the switching in the DAC.

9. The system of claim 8, wherein the second timing circuit is configured to generate the second timing output such that it adjusts timing of switching controlled based on the first timing output to ensure constant switching.

10. The system of claim 1, wherein the DAC comprises a plurality of elements, and wherein the plurality of timing circuits generate the timing outputs to control or adjust switching in only one or more of the plurality of elements.

* * * * *